US008504331B2

(12) United States Patent
Calmels

(10) Patent No.: US 8,504,331 B2
(45) Date of Patent: Aug. 6, 2013

(54) AERODYNAMIC MODEL IDENTIFICATION PROCESS FOR AIRCRAFT SIMULATION PROCESS

(75) Inventor: Benoit Calmels, Toulouse (FR)

(73) Assignee: Airbus Operations (S.A.S.), Toulouse (FR)

( * ) Notice: Subject to any disclaimer, the term of this patent is extended or adjusted under 35 U.S.C. 154(b) by 424 days.

(21) Appl. No.: 12/753,633

(22) Filed: Apr. 2, 2010

(65) Prior Publication Data

US 2010/0256962 A1    Oct. 7, 2010

(30) Foreign Application Priority Data

Apr. 3, 2009 (FR) ...................................... 09 52169

(51) Int. Cl.
  *G06F 7/60* (2006.01)
  *G06F 17/10* (2006.01)
  *G06F 17/50* (2006.01)
  *G06G 7/48* (2006.01)
  *G05B 13/02* (2006.01)

(52) U.S. Cl.
  USPC .......................... 703/2; 703/1; 703/6; 700/52

(58) Field of Classification Search
  USPC ............ 703/1, 2, 6, 8; 706/12, 15; 700/29–52
  See application file for complete search history.

(56) References Cited

U.S. PATENT DOCUMENTS

| 5,680,513 | A  | * | 10/1997 | Hyland et al. | ................... | 706/23 |
| 6,212,438 | B1 | * | 4/2001  | Reine         | ..............................| 700/48 |
| 2009/0164175 | A1 | * | 6/2009 | Redondo Garcia et al. | ...... | 703/1 |

OTHER PUBLICATIONS

Giunta, A.A. (1997) Aircraft multidisciplinary design optimization using design of experiments theory and response surface modeling. PhD Dissertation and MAD center report No. 97-05-01. Department of Aerospace and Ocean Engineering, Virginia Polytechnic and State University, Blacksburg, VA.*
Jin Y, Olhofer M, Sendhoff B (2001) Managing approximate models in evolutionary aerodynamic design optimization. In: Proceedings of IEEE Congress on Evolutionary Computation.*
Chen, Warren, "A Formulation of Nonlinear Limit Cycle Oscillation Problems in Aircraft Flutter", Jun. 1993, Massachusetts Institute of Technology, Department of Aeronautics and Astronautics.*
French Search Report dated Nov. 20, 2009.
R. Jategaonkar: "Aerodynamic Modeling and System Identification from Flight Data—Recent Applications at DLR" Presentation at RTO Mission in Tubitak-Sage, Ankara, May 26, 2008-May 29, 2008 pp. 1-47, XP002556427.

(Continued)

*Primary Examiner* — Mary C Jacob
*Assistant Examiner* — Aniss Chad
(74) *Attorney, Agent, or Firm* — Ingrassia Fisher & Lorenz P.C.

(57) ABSTRACT

A method is disclosed of identifying or fixing the value of the parameters (aerodynamic data) of a pre-determined set of equations forming the aerodynamic models of an aircraft in various configurations, so as to minimize the variance between the values anticipated by using these aerodynamic data, and reference data in cases of known configurations, includes the use of learning or optimization methods to determine at least one portion of the parameters' values. The method includes storing database data, choosing an optimization method or a neural network method, breaking the identification down into several partial identifications, carrying out successive partial identifications, validating the values found for the aerodynamic model's parameters or iterating the method according to a threshold criterion determined on the value of variances between the reference data and the values measured by the identified model.

5 Claims, 1 Drawing Sheet

OTHER PUBLICATIONS

Lee et al: "Estimation and validation of lateral-directional stability/control derivatives for the Flight Training Device of a light aircraft" Simulation Modelling Practice and Theory, Elsevier, vol. 16, No. 1, Jan. 1, 2008, pp. 1-14, XP022427060.

Lee et al: "Application of parameter estimation to FTD for a light airplane via flight tests" Simulation Modelling Practice and Theory, Elsevier, vol. 15, No. 6, May 30, 2007, pp. 690-702, XP022098346.

Bodson M Ed—Institute of Electrical and Electronics Engineers: "Identification with modeling uncertainty and reconfigurable control" Proceedings of the Conference on Decision and Control. San Antonio, Dec. 15-17, 1993; [Proceedings of the Conference on Decision and Control], New York, IEEE, US, vol. CONF. 32, Dec. 15, 1993, pp. 2242-2247, XP010116452.

* cited by examiner

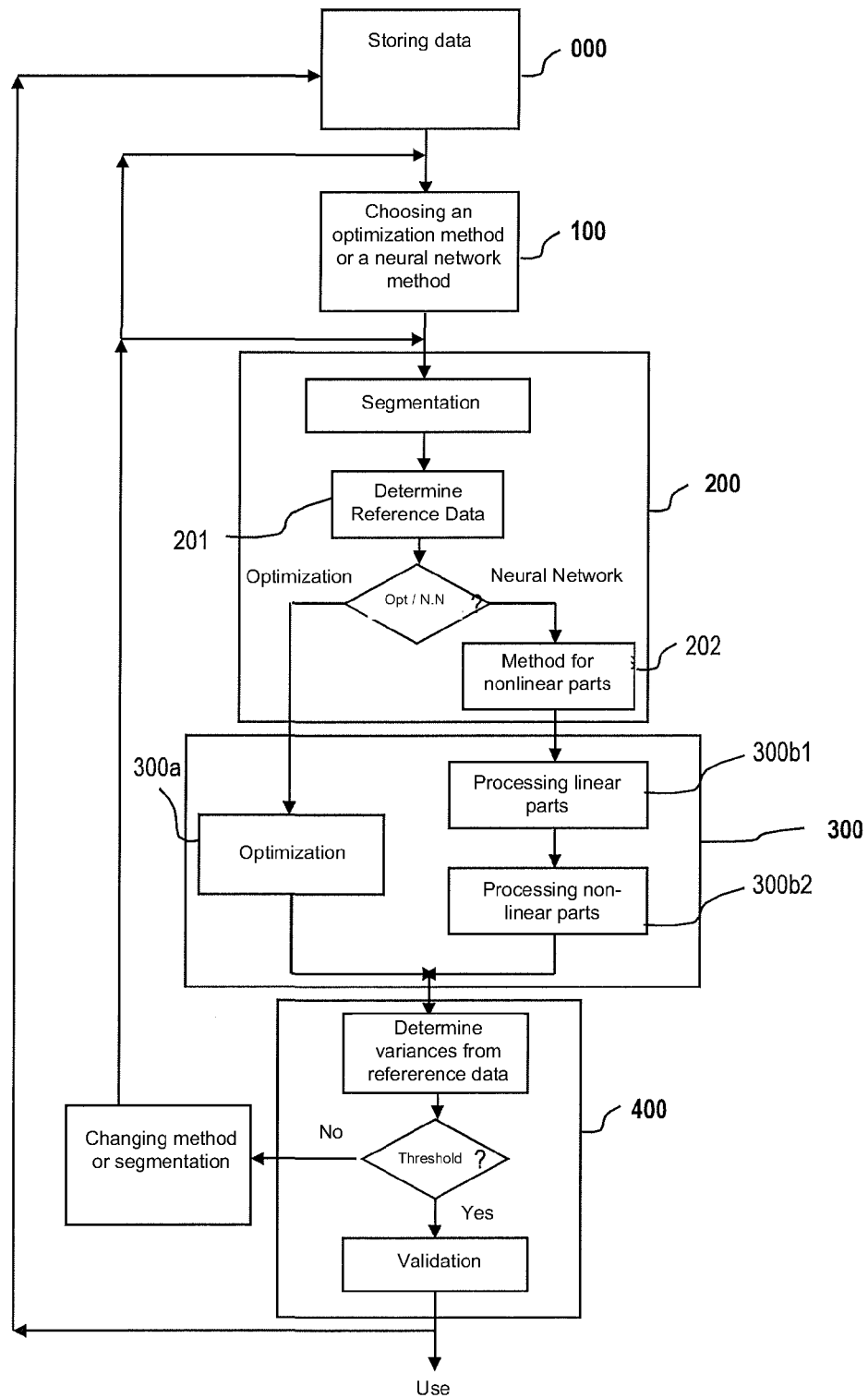

AERODYNAMIC MODEL IDENTIFICATION PROCESS FOR AIRCRAFT SIMULATION PROCESS

This application claims priority to and the benefit of French Application No. 09 52169 filed on 3 Apr. 2009, the disclosure of which is incorporated by reference in its entirety.

SUMMARY

The aspects of the disclosed embodiments fall within the field of aeronautical design. It concerns more specifically aircraft simulation methods. Even more specifically, it relates to methods for aerodynamically modeling an aircraft.

For each aircraft there is a set of aerodynamic models that characterize the aircraft's behavior in specific environmental and geometric conditions, and which therefore allow this to be simulated. Knowledge of these models is essential when a new aircraft is being developed.

More precisely, an aerodynamic model is a complex set of equations that make it possible to calculate the aerodynamic coefficients (such as Cz, Cx, etc) for a given aircraft from geometric parameters (geometry of the aircraft, position of the high-lift devices, deflection of control surfaces, etc) and aerodynamic conditions (Mach and Reynolds numbers, angles of incidence and side-slip, etc).

These models allow an aircraft's behavior to be calculated for the different flight conditions that it will experience in operation (take off, landing, cruising, etc).

The equations forming these models comprise a large number of parameters—the whole of which constitute the aerodynamic data specific to the aircraft and its flight conditions—that need to be determined for each aircraft during its design.

Moreover a certain amount of reference data is known for an aircraft in the process of development, produced by digital or experimental means (i.e. by using, in particular, semi-empirical methods, digital simulation methods, wind tunnel tests and flight tests).

The identification of the parameters of equations is therefore carried out on the basis of these reference data.

It consists of determining the value of the equations' parameters (aerodynamic data) so that the corresponding aerodynamic model best includes the reference data, by searching the best combination of parameters to explain these known reference data.

Traditionally, within the aerodynamic models the linear parts are distinguished, for which you need to identify the linear coefficients and the non-linear parts, which are tabulated in 1-, 2- or 3-dimensional tables that must also be identified. It is understood that this identification is a task that is very complex and decisive for the correct design of the aircraft.

Currently this identification is most often carried out by "Model engineers" with the help of spreadsheet software and linear regression methods.

Clearly this method is based on the know-how of the Model engineers, and it takes a large amount of work time: as an example, the identification of a simplified flexibility model dependant on two parameters typically requires two days work by the standard method.

However it is increasingly necessary to reduce the development cycle for new aircraft, and also the design cost of these aircraft.

This therefore poses the problem of reducing the time for identifying the aerodynamic models of an aircraft in the process of development.

The objective of the disclosed embodiments is to be able to perform this identification much faster, so as to contribute to reducing the development costs and times for new aircraft.

For this purpose, the disclosed embodiments concern a computer-assisted method for the digital simulation of an aircraft in a specific configuration, comprising a step of:

identification, i.e. fixing the value of the parameters (aerodynamic data) of a pre-determined set of equations forming the aerodynamic models of this aircraft, so as to minimize the variance between the values anticipated by using these aerodynamic data, and reference data in cases of known configurations, this identification comprises a step of using artificial learning or optimization methods to determine at least one portion of the parameters' values.

According to a preferred implementation, the method comprises steps of:
- 000—storing database data,
- 100—choosing an optimization method or a neural network method,
- 200—breaking the identification down into several partial identifications,
- 300—carrying out successive partial identifications,
- 400—calculating each of the variances between this model and the reference data,
- validating the values found for the aerodynamic model's parameters, if a value that is a function of the variances is below a pre-defined threshold, or otherwise iterating, by modifying the segmentation of the model and/or the choice of the optimization or learning method selected.

In a favorable implementation, in step 100, the choice comprises sub-steps of evaluating the complexity of the model to be identified and comparing the model being identified against a library of already known models for a certain number of geometries and configurations of aircraft.

Alternatively, in step 100, the choice is based on the complexity of the model to be identified, by creating a function taking into account the number of the model's equations, the number of parameters to be determined, the number of reference data, the number of non-linear parts in the equations for calculating an indicator, which will determine the choice of method to be used according to a logic stored beforehand.

More specifically, in step 200, the linear and non-linear parts of the equations forming each part of the aerodynamic model are separated for the identification.

Still more specifically, according to a preferred implementation, step 200 also comprises a sub-step 201 determining for each partial identification of the portion of reference data that has been used as an identification base: all of the reference data or just a part of these data.

For preference, in the case where use of a neural method has been chosen in step 100, step 200 also comprises a sub-step 202, in which a mode of representation is chosen for the non-linear parts of the equations constituting the aerodynamic model (either by tabulation, or by representation as a neural network), according to previously stored selection criteria.

In the case where a neural network method is chosen, step 300 preferably comprises two parts:
- 300$b1$—for the linear parts, the structure of the functions forming the model is kept completely, the neural network being used in these areas to optimize the value of the linear coefficients of the functions;
- 300$b2$—the non-linear parts are completely or partially modeled by neurons, the parts not modeled by neurons being tabulated.

It is understood that the method here uses hybrid models combining mathematical models and strictly neural methods.

Advantageously, with a view to feeding a learning process, step 400 comprises the storage of the aerodynamic model identified, the calculation method chosen, the segmentation schematic chosen in the model database, according to aircraft geometries and environment configurations or assumptions.

The disclosed embodiments also envisage a computer program product comprising program code instructions for executing steps of a method as described above when said program is run on a computer.

The description that will follow, given solely as an example of an embodiment of the disclosed embodiments, is made with reference to the figures included in an appendix, in which:

BRIEF DESCRIPTION OF THE DRAWING

FIG. 1 is a flowchart of the method according to the disclosed embodiments.

DETAILED DESCRIPTION

It is noted, in a preliminary way, that formal neural networks are calculation systems whose operation is inspired by that of natural neural networks, such as those in the human brain, for example.

Each formal neuron is therefore represented in the form of a calculation process and memory space in a calculation system.

Formal neural networks present a capacity for progressive learning. In effect, these artificial neural networks behave here in a similar way to natural neural networks. It is known that the neurons of a natural network such as the brain each initially have a very large number of connections (synapses) to other neurons, able to transmit electrical signals. Each neuron carries out a summation over time of the electrical signals received from other neurons and in its turn issues an electrical signal if this sum exceeds a certain threshold.

The connections between these neurons are progressively strengthened or, in contrast, deleted according to the stimuli received and the quality of the reactions formed by the network in response, thus creating a progressive human learning process.

In the same way, the formal neural networks are constituted of several layers of neurons, each of them comprising logical connections to the neurons of the next layer. In a way analogous to the natural neurons, each formal neuron sums the digital values it receives and issues a signal when a predefined threshold is exceeded. This signal can be positive or negative. Each formal neuron is therefore a linear transfer function of the data received.

Each connection between the formal neurons initially having the same weight (or synaptic coefficient), these weight are progressively increased or reduced during a trial-and-error process when the network is subjected to known input data and is expected to provide output data that is also known.

The learning algorithms of formal neural networks (for example, retro-propagation of the error gradient) and the implementation of a multilayer formal neural network (of the Multilayer Perceptron type, for example) are known to the expert.

The value of the weights of the connections between the network's formal neurons is the result of this learning process, and the users' knowledge or understanding of it is not necessary for it to operate properly.

Traditionally the formal neuron networks were for a long time unable to handle non-linear problems, this limitation being removed at the end of the 80 s with, amongst others, the multilayer networks.

As a result, formal neural networks are particularly well suited to resolving problems comprising a very large number of variables. They therefore make it possible to determine by approximation a function passing as close as possible through mandatory measurement points.

In the present case of aerodynamic models comprising many equations with multiple variables, two strategies at least can be considered.

In a first strategy, it is possible to seek to construct a neural network determining by approximation a function able to best explain the various measurement values recorded for the aircraft in question. This function is therefore of any form whatsoever.

In a second strategy, you seek to construct a neural network determining, by approximation, a combination of physical functions of a known form, said combination of functions best explaining the various measurement values recorded for the aircraft in question.

The method described here as an example uses this second strategy.

The disclosed embodiments find their role during the development of an aircraft, especially during its design phase.

The method according to the disclosed embodiments is intended to be implemented in the form of software, said software being run on an ordinary type of computer, for example a PC type of micro-computer equipped with standard interfaces, peripherals and storage means.

This computer is equipped with software libraries relating to implementing various standard optimization methods and modeling by neural networks or other learning modeling methods. These software libraries are of a type known to the expert and are therefore not detailed any further here.

This computer is, in the present example, interfaced in a network with a server comprising reference aerodynamic data relating to an aircraft in the course of development and also geometric data defining the aircraft's configuration.

000—Preliminary to the implementation of the actual method, these various data (reference aerodynamic data, geometric definition data) are then stored in the computer with a view to their processing during the implementation of the method.

All these data can, for example, be stored as a spreadsheet.

In the same way, the equations comprising the aerodynamic models to be identified are also stored as functions, using parameters that will be determined by using this method.

Finally, a database of aerodynamic models previously identified, according to the geometries and configurations of various aircraft, is also stored.

The implementation of the disclosed embodiments consists of using, depending on cases, an optimization method or a learning method (for example by neural network) to identify an aerodynamic model based on the reference data corresponding to this model's configuration case.

100—A first step therefore consists of choosing between using an optimization method or a neural network method. We seek here to determine the relevance of these two types of methods with regard to the specific case considered, this relevance being measurable in terms of the calculation time needed to reach a variance between the identified model and the reference data that is below a previously chosen threshold.

This choice is made based on the complexity of the model to be identified and according to recommendations concerning the use of optimization methods and neural network methods available. These recommendations are formalized for each of the methods based on criteria defining the nature and complexity of the aerodynamic model, and stored in the work computer.

The choice is generally linked to the complexity of the model studied.

In this step, one possibility is to compare the model being identified against a library of already known models for a certain number of geometries and configurations of aircraft.

Alternatively, the know-how of the Model engineers can be used to propose a choice of method, based on their previous experience in similar cases.

It is also possible to base this on the complexity of the model to be identified, by creating a function taking into account, for example, the number of the model's equations, the number of parameters to be determined, the number of reference data, the number of non-linear parts in the equations for calculating an indicator, which will determine the choice of method to be used according to a logic stored beforehand.

In a simplified way, the simpler the model is the more an optimization method can be used with success, whereas the more complex a model is the more a neural network method is called for.

The result of this first step is a specific method of optimization or modeling by neural network, from the methods available as software in the work computer's memory.

200—The second step of the method is a segmentation of the identification into several partial identifications. That is to say that the parameters of the equations forming a given model will be determined by groups, each time leaving the other parameters unchanged.

Such segmentation simplifies the implementation of, for example, neural network methods, which would otherwise use considerable calculation time.

This segmentation will be carried out according to the model's structure and segmentation rules based on this previously stored structure.

The segmentation can be carried out by following a logical breakdown of the aerodynamic models, according to a tree-structure of sections and sub-sections similar to that already used by the Model engineers. Such segmentation is generally linked to physical conditions. For example, it can be broken down into the clean configuration of the airplane, high-lift devices, control surfaces. Another example of segmentation (or sub-segmentation) can consist of a separation between the configuration with or without tail unit. Again another example distinguishes the case of ground-effect flight from the case of free-air flight.

In the present example of implementation, that is in no way limiting, we have chosen to separate the identification of the linear parts from those of the non-linear parts of the equations, for each part of the model coming from the segmentation of the latter.

201—For each partial identification the portion of the reference data that will be used as the identification base is determined (this can be all the reference data or only a portion of these data).

202—In the case where use of a neural method has been chosen in step 100, a mode of representation is chosen for the non-linear parts of equations constituting the aerodynamic model (either by tabulation, or also by representation in the form of a formal neural network), according to previously stored selection criteria.

These selection criteria can include a minimization of the volume of information to be stored (with a comparison of tables of values representing the weights of the neurons), a maximization of the processing speed (according to the complexity of the model and the type of neural network), or for example constraints of compatibility with the users of the models once identified.

300—The third step of implementing the method is the successive carrying out of partial identifications.

The optimization method or the learning method chosen in step 100 is implemented here for identifying each of the parts of the model determined in step 200.

300a—using optimization methods

The disclosed embodiments consist in this case of using an optimization method to fix the value of the parameters of the equations so as to minimize the variance between the corresponding aerodynamic models and the reference data stored previously (step 000).

There are very many optimization methods that can be used, for example gradient, conjugate gradient, etc, libraries of these optimization methods are known to the expert, and the choice of method depends on recommendations concerning the use of these methods with respect to the specific case of the model to be optimized. The optimization methods themselves are outside the framework of the disclosed embodiments and are not therefore described any further here.

As was stated during the segmentation step, given the considerable size of the models, it has been chosen to only identify a portion of the parameters forming these models each time, the rest being kept constant. For each part of the model, it has been chosen to proceed in several steps, in particular by first identifying the linear areas and then the non-linear areas.

300b—using neural networks

The method consists in this case of using a neural network to fix the value of the aerodynamic data so as to minimize the variance between the corresponding aerodynamic model and the reference data.

In the same way as using optimization methods, there are very many neural network methods that can be used (even if the processing of non-linear parts imposes the choice of certain types of networks: multilayer perceptron or other, with learning algorithm, etc), and these neural network methods are for example available as software libraries known to the expert. Here again the neural network methods themselves are outside the framework of the disclosed embodiments.

As indicated earlier, a neural network constituting a universal function approximator, it may be envisaged to entirely replace the aerodynamic model by a set of neurons.

It is however much more useful to preserve the actual structure of the aerodynamic models by proceeding in two parts:

300b1—the structure of the linear areas is kept completely, the neural network being used in these areas to optimize the value of linear coefficients;

300b2—the non-linear parts are completely or partially modeled by neurons, the areas not modeled by neurons being tabulated, as in the standard method. The neural network is used in these areas to optimize the value of the parameters of the neurons and the values of the tables.

Following identification, the neurons can either be kept or transformed into tables. For preference here, representation in neurons is kept. The choice of using a discretization of the function obtained in the form of a table of values depends on the needs of the downstream users of the aerodynamic models.

At the end of the third step an identified model is obtained, i.e. a model for which the value of each parameter is determined. The parameters of this model are then stored.

400—The fourth step consists finally of validating the values found for the aerodynamic model's parameters.

The value of each of the variances between this model and the reference data is calculated. This value allows the result to be qualified.

A total value of the variances greater than a pre-defined threshold possibly leads to a warning message or an iteration of the method, modifying for example the segmentation of the model (step 200) and/or the optimization or learning method chosen.

The validation of the aerodynamic model determined thus allows the model database to be enriched, as well as the database of chosen methods (step 100) and of chosen segmentation (step 200) according to aircraft geometries and environment configurations or assumptions.

At the end of the method, the aerodynamic model can also be compared to models of aircraft considered to be close.

As an example allowing the implementation of the method to be illustrated, we seek to perform the identification of a polar (curve of Cz as a function of alpha). This identification is performed here by using spreadsheet software programmed accordingly.

The purpose of this example is to identify the following model:

$$Cz=Cz0+Cza*\text{alpha}+DCz(\text{alpha})$$

That is to say, to determine the values of parameters Cz, Cz0 and Cza, and also the parameters allowing the definition of function DCz (alpha), by using data stored previously (obtained, for example, by direct measurement or simulation) as reference values.

Step 100—In the light of this model's reduced complexity, it is decided to perform the identification with the optimization method.

Step 200—The model is segmented into linear part and non-linear part

Step 300a—The identification is then performed in two successive steps:
  the identification of the linear part (Cz0+Cza*alpha) is performed first in the central portion of the polar; the 2 linear parameters Cz0 and Cza are identified (by a method of successive iterations as such outside the framework of the disclosed embodiments) so as to minimize the variance in the linear area between the linear model thus obtained and the reference polar;
  the identification of the non-linear part is then performed: Cz0 and Cza are kept at the value determined during the linear step and you identify (always by the method of successive iterations) a segmentation in alpha and the values of the corresponding non-linearities DCz so as to minimize the variance between the model thus obtained and the reference polar.

The method according to the disclosed embodiments provides a number of advantages.

It allows significant reductions in the engineer's time spent identifying aerodynamic models, this saving of time being translated into a direct financial saving for the company and playing a part in reducing the development cycle for airplanes.

Thus, for example, the identification of a flexibility model dependant on two parameters, which typically requires two days work by the standard method, can be performed in half an hour by using the method according to the disclosed embodiments.

This reduction in identification time opens up the possibility of quickly trying alternative models, which allows improved models to be produced, especially in terms of accuracy; this improvement of the models thus makes it possible to reduce the dimensioning margins and therefore improve the airplanes.

This reduction in identification time also opens up the possibility of trying the models directly during the wind tunnel tests (and not only after the tests have finished), which allows the test programs to be adapted in the light of the results of this identification, here again producing an improvement in the models' accuracy.

It is understood that the method can be applied for all the aerodynamic models, whether their purpose is to determine flight qualities, performances or loads, and whether they include the flexibility of the airplanes or not. It also applies whatever the type of data used for the identification (coming from semi-empirical methods, digital simulation methods, wind tunnel tests, flight tests or any other means). Similarly, it can be used at all stages in the development of airplanes, and naturally for any type of airplane.

The scope of the disclosed embodiments is not limited to the details of the forms of embodiment considered above as an example, but on the contrary extend to modifications in the reach of the expert.

This description has mentioned the use of optimization methods or neural methods. In fact, it is also possible to use other learning methods, and for example genetic algorithm methods.

In the description, it was decided to begin by choosing a method (optimization or learning) before possibly segmenting the model into parts whose parameters are identified separately. Clearly, the inverse option can also be used, with a segmentation of the model followed by choosing an identification method for each part of the model.

Parts 100 (choosing an optimization or neural method) and 200 (segmentation of the model) can also be the subject of a learning process. In this variant, the database of known aerodynamic models is used for geometries and configurations of aircraft already studied in the past.

In this way you determine a method choice function and a segmentation function by neural network method with learning algorithm, and as validation criterion a variance between the aerodynamic models obtained by the method and models already known.

The method is iterated as long as the variance remains greater than a previously chosen value. At the end of the learning process on these models known beforehand, choice and/or segmentation functions are obtained.

In this variant, the method continually integrates the new identifications to its learning process.

The invention claimed is:

1. Computer-assisted method for identifying parameter values for a pre-determined set of equations forming aerodynamic models of an aircraft, wherein the identification of the parameter values comprises the following steps:
  000) storing reference aerodynamic data relating to the aircraft,
  100) choosing a neural network method;
  200) separating the identification of the parameter values into a plurality of partial identifications by separating linear and non-linear parts of the pre-determined set of equations forming the aerodynamic models;
  selecting a mode for representing the non-linear parts of the predetermined equations from one of tabulation or representation as a neural network
  300) carrying out the partial identifications successively, 400) calculating a variance between the parameter values and the reference aerodynamic data, and validating parameter values for which the variance is below a pre-defined threshold, and for those parameter values for which the variance is above the pre-defined threshold, repeating steps 100) through 400) while:

in step 100), choosing an optimization method: and in step 200), separating the identification of the parameter values into a plurality of partial identifications by: determining a portion of the reference aerodynamic data to be used for each partial identification.

2. A method according to claim 1, wherein in step 100, choosing the neural network method comprises evaluating a complexity of one or more of the aerodynamic models and comparing the one or more aerodynamic models against a library of known aerodynamic models for a certain number of geometries and configurations of aircraft.

3. A method according to claim 1, comprising storing at least the following according to aircraft geometries and environmental conditions:

the aerodynamic models of the aircraft, the neural network method chosen in step 100, and the plurality of partial identifications determined in step 200.

4. A computer program product embodied on a non-transitory computer readable medium, comprising program code instructions for executing the method according to claim 1 when said program is run on a computer.

5. Computer-assisted method for identifying parameter values for a pre-determined set of equations forming aerodynamic models of an aircraft, wherein the identification of the parameter values comprises the following steps:

000) storing reference aerodynamic data relating to the aircraft,

100) choosing a neural network method;

200) separating the identification of the parameter values into a plurality of partial identifications by separating linear and non-linear parts of the pre-determined set of equations forming the aerodynamic models; and modeling at least a portion of the non-linear parts using neurons, and tabulating any non-modeled portion of the non-linear parts;

300) carrying out the partial identifications successively,

400) calculating a variance between the parameter values and the reference aerodynamic data, and validating parameter values for which the variance is below a pre-defined threshold, and for those parameter values for which the variance is above the pre-defined threshold, repeating steps 100) through 400) while:

in step 100), choosing an optimization method: and in step 200), separating the identification of the parameter values into a plurality of partial identifications by:

determining a portion of the reference aerodynamic data to be used for each partial identification.

* * * * *